(12) United States Patent
Baartmans et al.

(10) Patent No.: US 7,269,756 B2
(45) Date of Patent: Sep. 11, 2007

(54) CUSTOMIZABLE EVENT CREATION LOGIC FOR HARDWARE MONITORING

(75) Inventors: Sean T. Baartmans, Chandler, AZ (US); Bryan R. White, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 491 days.

(21) Appl. No.: 10/808,000

(22) Filed: Mar. 24, 2004

(65) Prior Publication Data

US 2005/0223300 A1    Oct. 6, 2005

(51) Int. Cl.
*G06F 11/00*   (2006.01)

(52) U.S. Cl. .............. 714/30; 714/31; 714/32

(58) Field of Classification Search ............. 714/30, 714/32, 33
See application file for complete search history.

(56) References Cited

U.S. PATENT DOCUMENTS

| | | | |
|---|---|---|---|
| 6,728,901 B1* | 4/2004 | Rajski et al. | 714/30 |
| 6,871,297 B2* | 3/2005 | Puri et al. | 714/30 |
| 6,954,888 B2* | 10/2005 | Rajski et al. | 714/739 |
| 7,058,856 B2* | 6/2006 | Shinmori | 714/30 |
| 7,100,086 B1* | 8/2006 | Kudo et al. | 714/30 |
| 2004/0163013 A1* | 8/2004 | Watt et al. | 714/30 |

* cited by examiner

*Primary Examiner*—Scott Baderman
*Assistant Examiner*—Tim Bonura
(74) *Attorney, Agent, or Firm*—Blakely, Sokoloff, Taylor & Zafman LLP (57) ABSTRACT

In one embodiment, the invention may include a logic structure integrated in an integrated circuit (IC), that has a set of bus inputs to generate events, a mask register to select inputs from among the set of bus inputs, a logic register to select logic to apply to the selected inputs and an event output to supply the result of the applied logic. The embodiment may further include a bus interface integrated in the IC and coupled to the logic structure to transmit settable parameters to the mask register and the logic register of the logic structure from an external agent.

24 Claims, 7 Drawing Sheets

CUSTOMIZABLE EVENT CREATION LOGIC FOR HARDWARE MONITORING

BACKGROUND

Embodiments of the present invention relate to the field of performing diagnostics and testing on integrated circuits and, in particular, to integrated logic structures for creating events that can be used to feed integrated hardware registers.

Some integrated circuits (ICs) include registers or counters that can be used to store results of diagnostic or performance tests. The counters can also be used to monitor specific hardware events in the IC. The counters are used by internal processes and by externally driven processes. Counter values can be accessed by external devices through communications buses, such as a configuration bus or a debug bus, used in some ICs. A configuration bus is used for programming the chip during normal operation. For example, a CPU (Central Processing Unit) can initiate cycles which read or write registers in an MCH (Memory Controller Hub). A debug bus is used for observing internal logic for debug purposes.

In order to feed values to the counters, a unit within the IC is designed with all the necessary logic at the source of the signals that are to be tested for that unit. The logic at each unit is specifically designed for its unit to perform functions believed to be important at the time that the unit is designed. In a conventional implementation, the logic is activated by an external or internal trigger event. It performs the function for which it is designed and the result is fed as an event indication to a counter or register. This register can be read using the chip's configuration bus or the register can be observed using the debug bus.

Logic gates are accordingly added to the IC for each event that is to be monitored. This can significantly add to the gate count of the system, while at the same time, the specific logic design limits flexibility as it is typically hard-coded as firmware.

The integral logic at each unit also limits the tests to those that are developed during the circuit's initial design. Any tests that are developed after tape out cannot be performed. The requirement to provide for all necessary tests in advance can also slow development of the IC while time is spent thinking of possible bugs and events for test. The diagnostic logic, because it is located at the source of a signal is further not well adapted to test combinations of signals that are generated by different units of the IC.

BRIEF DESCRIPTION OF THE DRAWINGS

Embodiments of the present invention will be understood more fully from the detailed description given below and from the accompanying drawings of various embodiments of the invention. The drawings, however, should not be taken to be limiting, but are for explanation and understanding only.

DETAILED DESCRIPTION

In one embodiment, a flexible logic can be used to create events similar to those that can be generated at a source unit but without using logic at the source unit. This reduces gate count by not requiring the same logic to be instantiated multiple times within a unit and across units By placing the logic in a global location, gate count is significantly reduced. These created events can be used in a variety of ways. One way is to feed the events to monitoring or diagnostic counters. A second way is to route created events, in lieu of portions of a debug bus, to pins on the chip for external observation during debugging. A third way is to generate an interrupt, such as an SMI (System Management Interrupt). The SMI can be used to trigger software to respond to a detected condition.

Some ICs include monitoring or diagnostic counters. An example of one such type of monitoring or diagnostic counter is a CHAP counter. Flexible logic structures can be used to create events that can be fed directly into the counters. Configuration and mask registers can be included in the flexible logic to determine the types of events and how the results are fed to the counters.

One application of a CHAP (Chipset Hardware Architecture Performance) counter is to monitor the levels of a queue. For a queue that outputs the actual level, this means that for each level that is monitored, a comparator is required at the source. Since there are multiple queues in the design, placing comparators at each source would cost many more gates than it takes to implement them in a centralized location. The estimated gate count savings of having this logic in a central location associated with a CHAP counter is on the order of 10 to 100 times the amount of gates that it would take to implement this at the individual queues (depending on how many queues were instrumented). This approach also saves design time as the individual designers do not have to spend time constructing additional observation logic in their designs. Further, because the flexible logic allows event creation, this removes the requirement to determine which events will be important prior to silicon. A debug bus with a capability for a wide variety of signals from each of the source units can be used together with the flexible logic to create the events for the source units. The results can be tapped off the debug bus allowing them to be monitored.

Figure 1:
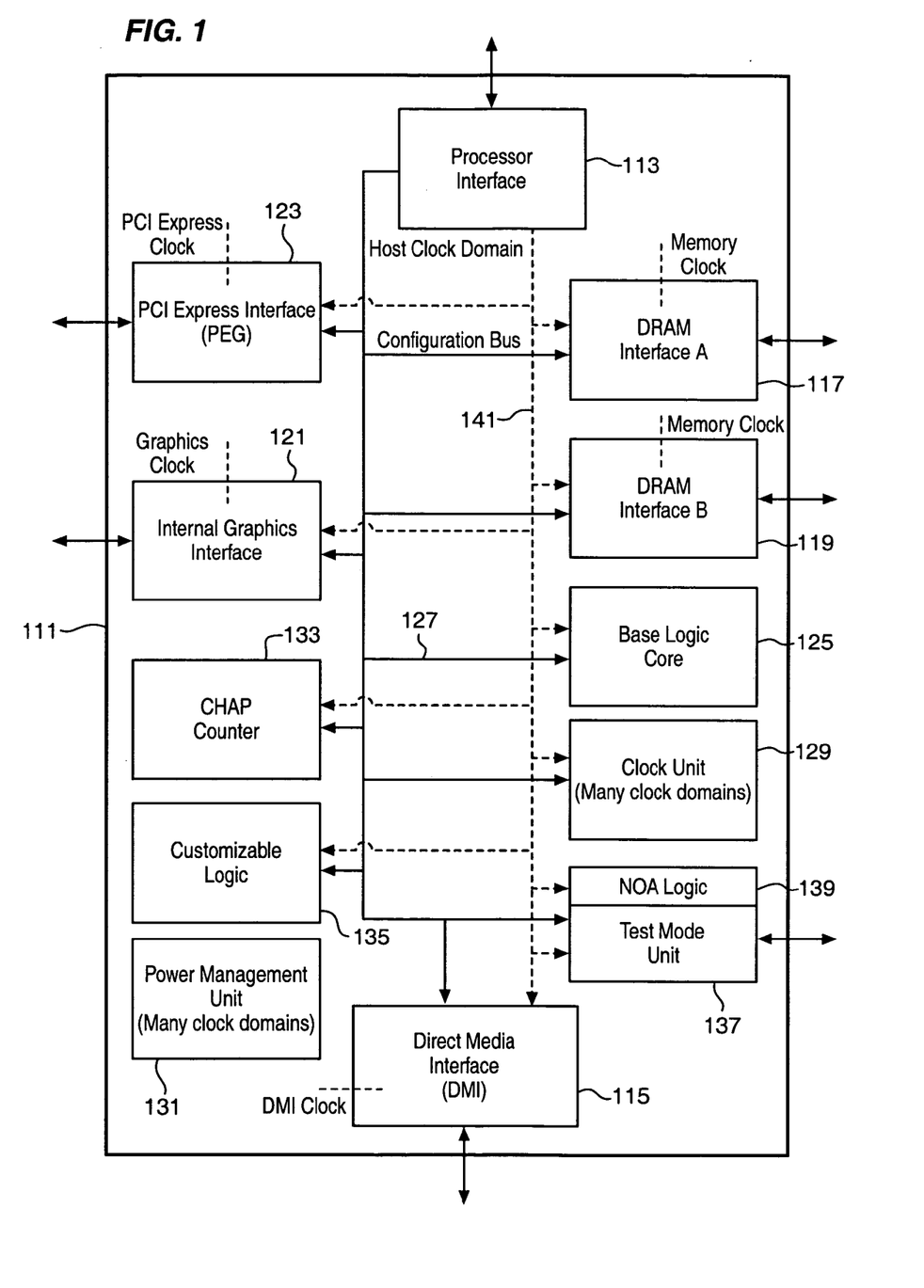
FIG. 1 is a block diagram of an integrated circuit including customizable logic coupled to counters according to an embodiment of the present invention.

FIG. 1 shows an example of an integrated circuit suitable for use with an embodiment of the present invention. In the example of FIG. 1, the integrated circuit is a Memory Controller Hub (MCH) chip. The MCH chip together with an ICH (I/O controller hub), functions as a supporting chipset for a CPU. Any number of different CPU's and chipsets may be used. In one embodiment, an Intel® Pentium® 4 processor with an Intel® MCH chipset is used, however embodiments of the invention are not so limited. The MCH chip 111 includes several interfaces to external devices. These include an interface 113 to the processor and a north bridge interface 115 or direct media interface (DMI) coupled to an ICH, such as an Intel® ICH6 chip. Note that embodiments of the invention are not limited to the particular choice of processors and supporting chips suggested herein.

The MCH chipset has a DRAM interface A 117 and DRAM interface B 119 coupled to on-board memory, such as DRAM (Dynamic Random Access Memory). The chipset may also have an internal graphics interface 121 to couple with a graphics controller or other specialized controllers and a PCI Express Graphics Interface (PEG) to couple with any of a variety of different PCI Express bus devices. These particular interfaces are provided as examples only. An MCH chip may have more or fewer or different interfaces than those shown and ICs with other types of interfaces may also benefit from embodiments of the present invention.

The MCH chip also includes a base logic core 125 coupled to each of the interfaces mentioned above by a configuration bus 127 to perform the basic processing on the chip and to control all the interfaces. A clock unit controlled by the base logic core provides timing for all of the components of the chipset and a power management unit provides appropriate voltages to each of the interfaces and related devices.

For testing and analysis, the chip includes a CHAP counter 133, customizable logic 135 and a test mode unit 137 all coupled to the configuration bus and accessible by the base logic core. The customizable events produced by the customizable logic 135 and the debug bus feeding into it may be routed to external pins for observation. One way to do this is to route through the test mode unit 137. This is shown in FIG. 1 by the interface arrows of the Test Mode unit. In one embodiment, the test mode unit can control which events or debug signals appear on the external pins. Another way is to route the events directly to an external pin interface. A third way is to route the events on the debug bus or some other bus. These units are described in more detail in association with the figures that follow.

The chip also includes NOA (Node Observation Architecture) logic 139 associated with the test mode unit. The NOA logic manages the debug (or NOA) bus and selects eight signals from thousands of signals that may be present on the bus. The eight selected signals may be ported to the customizable logic and the CHAP counter. All of the units of FIG. 1 mentioned above are also coupled to a debug bus 141. The debug bus allows signals and events on each of the connected units to be monitored.

FIG. 1 also shows that the MCH chip can contain different clock domains that may be maintained by the clock unit 129. All of the units, including the processor interface operate at least in part on a host clock. The DMI interface also operates on a DMI clock. The DRAM interfaces A and B also operate on a memory clock. The PCI Express Interface also operates on a PCI Express clock and the graphics interface also operates on a graphics clock. The other units of the IC may operate on any one or more of these clocks or a separate clock that is optimized for those units. The multiple clock domains allow the MCH chip to be optimized for the best performance of each device interface. However, the clock unit is made more complex in order to support all of the clock domains. Any one or more of the clock domains may be combined in certain embodiments as appropriate to a particular application.

Figure 2:
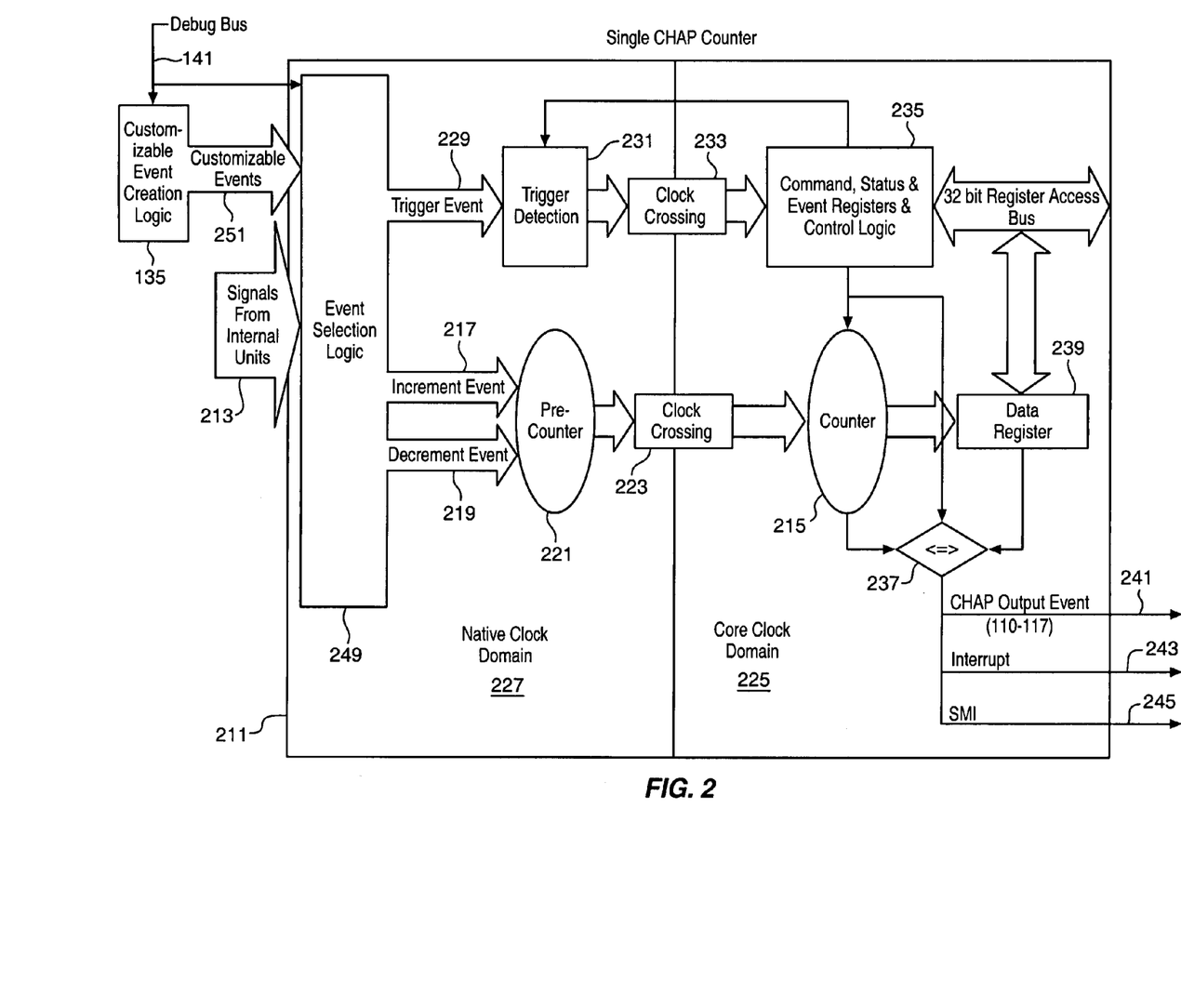
FIG. 2 is a block diagram of customizable logic and a counter from among the CHAP counters of FIG. 1.

FIG. 2 shows a single one 211 of the CHAP counters 133 of FIG. 1 coupled to the customizable event creation logic 135. The customizable logic receives signals on the debug bus 141 from other units of the chip. These signals are driven or monitored based on the particular settings of the logic and the counter as described in more detail below and may include signals and events from any of the connected external units of the chip. The customizable logic takes a portion of the debug bus and then feeds customizable event outputs to event selection logic 249 which is a part of the CHAP counter 211. After some processing, these events are accumulated in a counter 215 within the CHAP counter unit 211. The event output from the event selection logic may include an increment event line 217 and a decrement event line 219. These both feed into a pre-counter 221 before the counter 215.

The events may include duration events and occurrence events among others. One example of a duration event is when a signal is asserted for one or more clock ticks to represent the duration of a certain event. These may represent conditions in which a unit is stalled or data starved. Measuring such event results may indicate the elapsed time for certain intermediate events. Another example of a duration event may be when a signal is asserted while a pipeline stage is prepared to transfer its data to the next stage, but the next stage in the pipeline is stalling it. When the stall is no longer in effect, the signal will be deasserted.

An occurrence event may be used, for example, for a count of the number of times something happens, regardless of how long it takes each event to occur. One useful application of occurrence events is for counting cache misses. Regardless of the type of the event, the same counter may be used in much the same way.

The pre-counter accommodates a clock crossing 223. In the present example, the IC runs on several different clocks. The CHAP counter accommodates the different clocks using two different domains. A core clock domain 225 uses the base logic core clock. This aids communications with the logic core and with external devices. A native clock domain 229 is set to the clock rate of the unit that is under test. In other words, the native clock domain uses the clock that is native to the unit under test. The clock domain can be configured using registers in the logic as described in more detail below. The native clock domain facilitates the communication of events and signals with the unit under test. The clock crossing accommodates the difference between the two domains.

The event selection logic 249 of the CHAP counter also receives signals from internal units. In one embodiment, this logic is implemented as a set of multiplexers. This logic also sends trigger events 229 to a trigger detection block 231. When a trigger event is detected at the detection block, it is sent through a clock crossing 233 to a set of registers and logic 235. These registers and logic contain command, status and event registers and control logic to affect the results that are stored in the counter. The command, status and event registers are settable parameters that can be used to control the types of tests and monitoring functions that are performed by the CHAP counter and associated logic.

Based on events and register values, the registers and control logic send commands to the counter and to the trigger detection block. The commands to the counter may include start, stop, reset, restart, preload and sample commands, among others. The commands to the trigger detection block may be used to set how trigger events are to be detected. In one embodiment, a stop command may mean that the corresponding counter does not count. A start command may mean that the corresponding counter begins counting. Each counter may increment by one if the corresponding increment event occurs or decrement by one if the corresponding decrement event occurs. To set particular functions, the desired increment and decrement events may be selected before the start command executes. Duration type events may be counted by setting the counter to toggle with every CHAP unit clock tick for which an event is true.

A sample command may mean that the corresponding counter value is latched into the corresponding data register 239, which can then be read by reading the appropriate data register. The counter may continue to count without being reset.

A reset command may mean that the corresponding counter and register is reset to 0000 0000h. With a 32 bit wide data register 239, 4 billion clock ticks or occurrences may be counted between sample commands. When the counter rolls over, an overflow status bit may be set in a corresponding status register.

A restart command may mean that the corresponding counter resets, then starts counting again. This is like a Reset & Start command. Such a command may facilitate histogramming by allowing an event to trigger to clear the counter and resume counting with no further intervention. A sample & restart may mean that the Sample command happens and is followed immediately by a Restart command.

A preload command may mean that the corresponding counter is set to a value that is located in an associated data register. This facilitates rollover and overflow validation. The counter remains in the same state when preloaded. If the counter was counting before the preload was executed it will continue to count after the preload.

The registers and control logic 235 also control a compare function 237 that is coupled to the counter 215 and to a data register 239. The particular compare function is set by the registers and control logic and may include greater than, less than, and equals, among others. The data register value may be set by the registers and control logic or by an external device. The result of the comparison may be an output event 241, an interrupt 243, or an SMI (System Management Interrupt) 245, among others. The interrupts may appear as cycles either directly to the CPU via the processor interface 113. Alternatively, the interrupt or SMI may route to the ICH through the DMI 115. If the interrupt or SMI routes to the ICH, the ICH may interrupt the CPU. In particular an SMI may allow a particular state or condition to be alerted to the software, e.g. the BIOS (Basic Input/Output System). If the SMI indicates a failure or error mode, the software may then correct the state or condition. In some embodiments, using an SMI can allow bugs and incompatibilities detected after the chip design is finalized to be corrected using a BIOS patch or upgrade. While, for the CPU and chipset combination suggested herein a BIOS patch may be used, embodiments of the invention may be adapted for other types of IC and software combinations.

Figure 3:
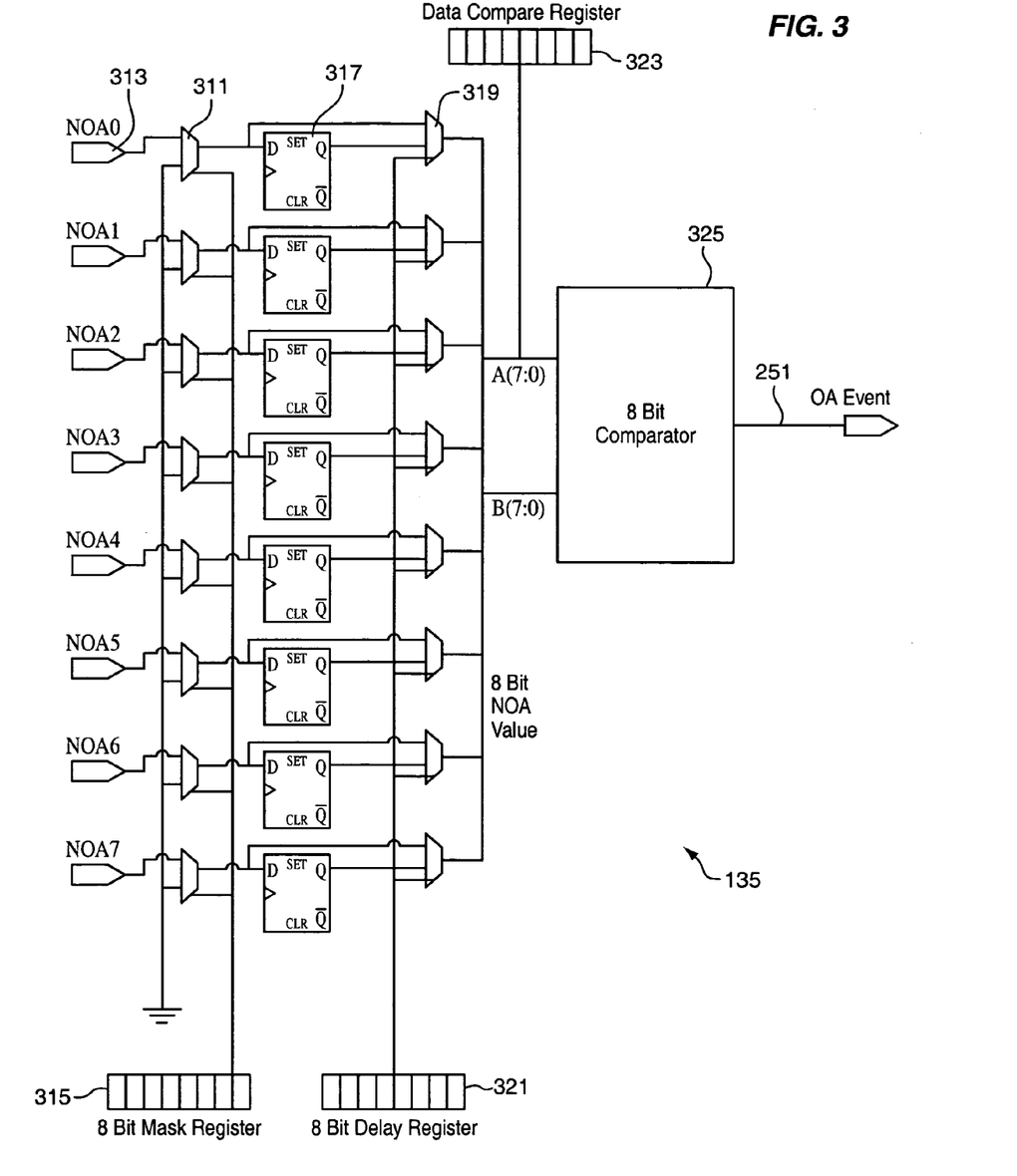
FIG. 3 is a block diagram of the customizable logic of FIG. 1.

FIG. 3 is a diagram of hardware that may be used to implement the customizable event creation logic 135 according to one embodiment of the invention. The described example uses an eight-bit bus and eight-bit registers, however, the particular scale of the buses and registers is not an essential feature of embodiments of the invention. In FIG. 3, a set of eight multiplexers 311 or one eight-bit multiplexer may be coupled to eight input signal lines 313 corresponding to NOA (Node Observation Architecture) signals registers NOA 0 to NOA 7. These lines carry the debug bus 141 signals illustrated in FIG. 2.

Each of the multiplexers is further coupled to a mask register 315. In the present example, the mask register is an eight-bit register with one bit per multiplexer. The mask register may be used to enable or disable each of the eight input signal bits from each of the eight input signal lines.

Each of the eight input signal bits is supplied, if enabled, to the corresponding D input of one of a set of eight D-type flip-flops 317. The Q output of each flip-flop is coupled to an input of another one of a set of eight multiplexers 319, or a gate of an eight-bit multiplexer. The other input of each of the eight multiplexers is coupled to one bit of an eight-bit delay register 321. The delay register can be used at each multiplexer to enable or disable the delay from the corresponding flip-flop. The resulting eight-bit NOA value is then applied to a comparator 325, which performs a comparison based on an eight-bit data compare register 323. If an event occurs then this is provided as an OA event 251 to the event selection logic of the CHAP counter 211.

In one embodiment, the comparator 325 executes a compare function that may be set by a three bit register, allowing for eight possible functions. In more detail, some useful functions may include:

OR, compare and assert the output if any are equal to the data register;

\>, compare and assert the output if greater than the data register;

=or AND, compare and assert the output if equal to the data register;

≧, compare and assert the output if greater than or equal the data register;

<, compare and assert the output if less than the data register;

≦, compare and assert the output if not equal to the data register;

=, compare and assert the output if less than or equal to the data register.

Figure 4:
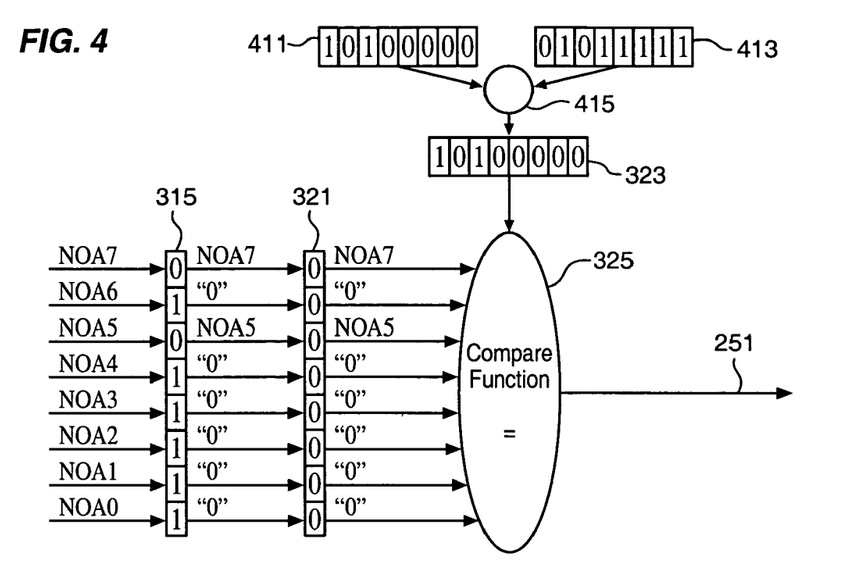
FIG. 4 is a functional diagram of using mask, delay and compare registers to create an AND of two events according to an embodiment of the invention.

FIG. 4 shows an example of using the mask and delay registers of FIG. 3 to perform event tests using the customizable event creation logic described above. In FIG. 4, the test is an AND of two events. In FIG. 4, the bits of the mask register 315 of FIG. 3 have been set through the configuration bus to select NOA signals 5 and 7. The other signals have been disabled. The delay register bits 321 corresponding to the delay register of FIG. 3 have been disabled. Delay is not used to perform this AND. The particular events to which NOA5 and NOA7 correspond are determined by the control logic 325 of FIG. 3 and may be any type of output or event at another unit of the IC. This AND test can be applied to any two outputs or events depending on the particular type of test that is to be performed.

The NOA5 and NOA7 signal are next applied to the compare function 325. The particular function is set by the data compare register 323 shown in FIG. 3. In this example, it is set to equals (=). This compare function is controlled using a compare register 411 and a compare mask register 413. These two registers are applied to a multiplexer 417 which then sets the data compare register 323.

In this example of performing an AND of NOA5 and NOA7, the compare register is set to 00000101 and the mask register to 11111010 so that the compare function result is xxxxx1x1. When applied to this compare function an output event will occur at line 251 when both NOA5 and NOA7 are high. Using similar principles, the same structure can, for example, be used to create an event when NOA 5 is high and NOA 7 is low by setting the compare register 411 to 00000100 and the mask register 413 to the same value as for the AND function. Any number of different logic tests can be applied to the NOA register outputs using this approach. As mentioned above, the event on line 251 can be used in many ways. Some examples are that it can be applied to a CHAP counter, observed directly through external pins or a bus, or used to generate an SMI. The SMI may be directed to software as described above to correct a particular system or unit state.

Figure 5:
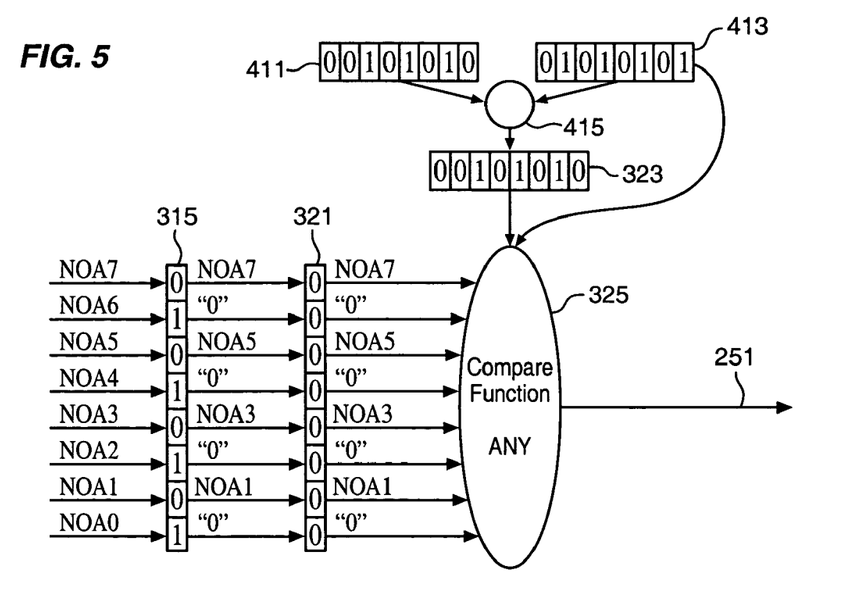
FIG. 5 is a functional diagram of using mask, delay and compare registers to create an event when one or more of a set of conditions are true according to an embodiment of the invention.

In FIG. 5, an event is created when any of a set of conditions is true. In this ANY function example, the mask register is set to 10101010 and the delay register is not used. This allows NOA inputs 1, 3, 5, and 7 to come through the mask. The delay register is not used (set to 00000000). The compare function is set to ANY. The compare register is set to 01010100 and the compare mask register to 10101010. This results in a compare function register value of x1x1x1x0. As a result, the output 251 will be asserted whenever NOA 1,3, or 5 is high or NOA 7 is low. As with the example of FIG. 4, any one or more of the settings described above can be adjusted to generate a wide range of different variations on this ANY test.

Figure 6:
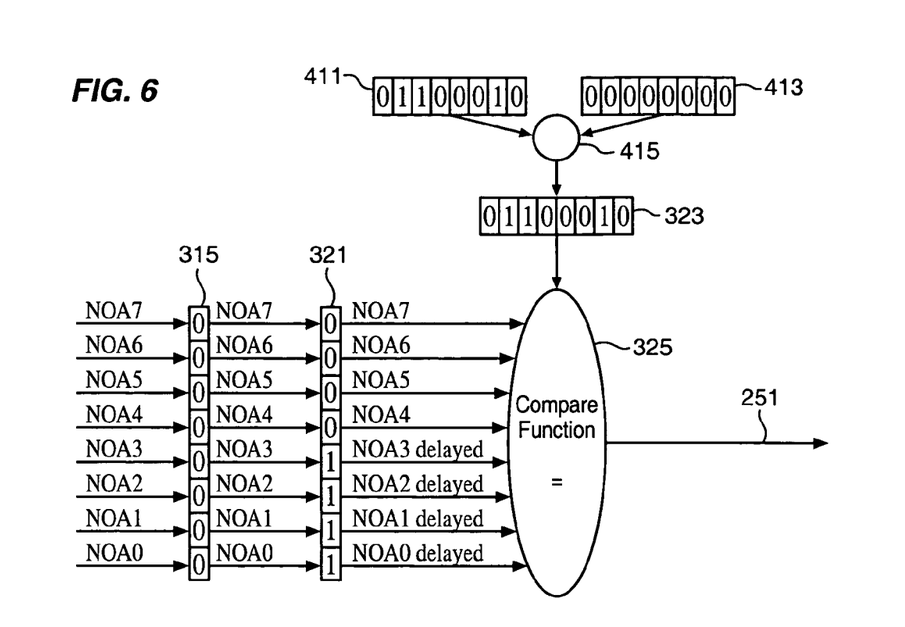
FIG. 6 is a functional diagram of using mask, delay and compare registers to monitor state machine transitions according to an embodiment of the invention.

In FIG. 6, the flexible logic is set to monitor a state machine transition. In this example, the mask register is not used. It is set to 00000000, so that all bits NOA0-7 are applied to the delay flip-flops. The delay registers are set to 11110000, so that NOA0-3 are delayed and NOA4-7 are not. To use this as a state machine transition, NOA lines 0-3 represent the current state of the state machine that is being monitored. NOA lines 0-3 are duplicated by the debug bus onto NOA lines 4-7. The particular states to be monitored are determined by using the configuration bus and by setting parameters in the control logic.

The compare function is again set to equals (=). The compare register is set to 01000110 and the compare mask is not used (00000000) so that the compare function register is 01000110. These settings create a state machine that generates an event on line 251 when the state machine transitions from 0100 on NOA inputs 0-3 to 0110 on NOA inputs 4-7.

Figure 7:
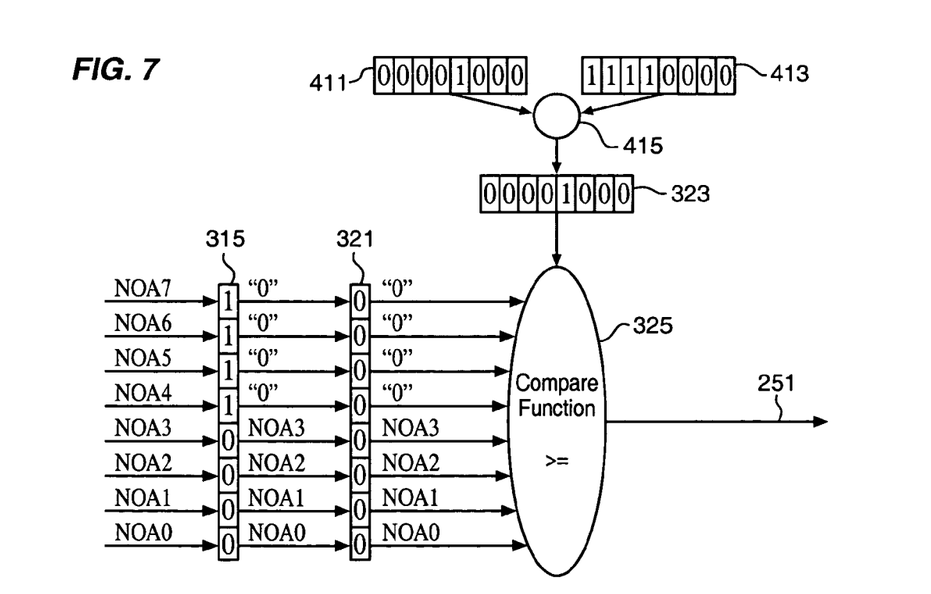
FIG. 7 is a functional diagram of using mask, delay and compare registers to monitor queue levels according to an embodiment of the invention.

FIG. 7 shows an example of monitoring a queue level using the flexible logic. In this example, the mask register is set to 00001111, so that only inputs NOA0-3 are used. The delay register is not used (00000000). The compare function is set to greater than or equal to (>=) and the compare register to 00010000. This is multiplexed with the compare mask values of 00001111 for a result of 0001xxxx. This setting will provide an output on the event line whenever the queue is half full, i.e. whenever NOA0-3 are all high.

As can be understood from the description above, the customized logic and counter combination provides many new capabilities. One such new capability is counting events directly to monitor performance. This can be done on a time or event basis. In time-based sampling, a memory-mapped register may be polled for counter values. In event-based sampling, specified events may control when counters are sampled. Another new capability is that counters can increment and decrement by 1 each clock. Each counter can also do comparisons against a threshold using operations such as greater than, less than and equals. In addition, there is a great variety of different types of data that can be gathered. These include utilization (duration) data, workload characterization (occurrences) data, and queue analysis. Both queue depth and head of queue (HOQ) measurements (histograms) can be taken.

The design described above also permits the number of counters and the amount of logic and associated registers to be increased on the IC to fill the available white space. A larger amount of logic and counters increases the possible simultaneous processes and the possible complexity of the event schedules. The design is very flexible as it can be added to a variety of different types of ICs and a standardized interface can be used, if desired. The scheduled tests are also very flexible and tests or events can be added long after the IC design has been completed. It is also possible to add counters, logic and associated registers in an external device. For example, for the MCH chip described above, a counter and logic unit can be added as a PCI device on the PCI bus. Several others of the communications devices on the MCH chip can also be used.

By integrating flexible logic on the IC, the number of possible tests is unlimited and the speed at which the tests can be performed increases greatly. The ability to design and perform new tests helps to adapt an IC to a new application after its design has been finalized. For many ICs, the primary applications are designed a few years after the chip's design has been finalized. As lessons are learned about possible new applications or existing applications, new tests can be designed to address emerging issues. This can improve reliability while also reducing system design time. The higher speed at which tests can be performed allows more thorough testing and analysis to be performed in the same time frame. In addition, specific tests can be developed by those who are developing a particular application, rather than being developed by a chipset designer. This allows the application developers more control and more insight into how to refine the desired application for the particular ICs.

Figure 8A:
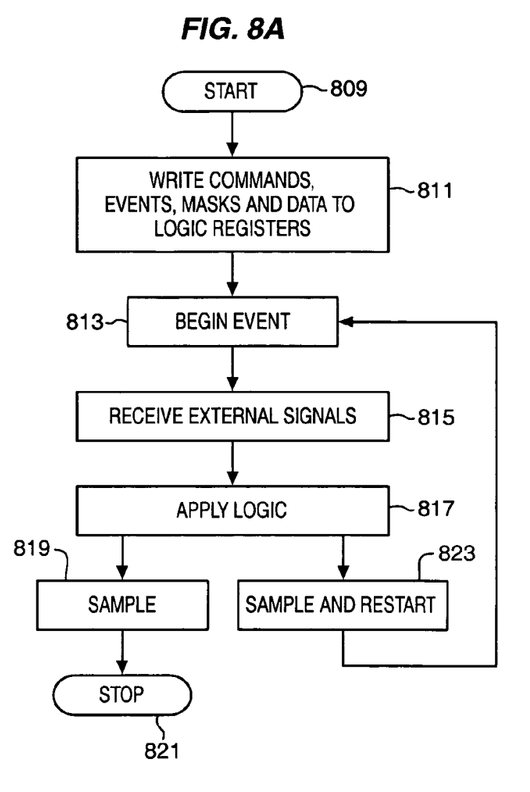
FIG. 8A shows a first conceptual flow process performed according to an embodiment of the invention.

FIG. 8 shows a first conceptual flow chart of a test process that can be performed according to embodiments of the invention. A broad range of different tests are possible using the structure described above. For some tests, the command flow starts at block 809 and then may begin with writing settable parameters to the customizable logic and the CHAP counter registers at block 811. This may include writing values to mask and delay registers, writing values to data and command registers and more. The values may all be written on the configuration bus. The counter may then be issued a start command at block 813. This begins the process that is to be tested or monitored. Corresponding signals are received at e.g. the debug bus of the flexible logic at block 815. The selected logic functions are then applied to the received signals at block 817. This may include applying masks, delays, multiplexing signals, comparing signals etc. The events are counted by the counter at block 819 by sampling or any other process. When the counter value is established the process stops at block 821. Alternatively, instead of stopping after establishing the counter value, the process may execute a sample and restart at block 823. The restart can be directed to any portion of the logic, depending on the selected parameters. In the illustrated embodiment the process returns to beginning the event at block 813.

Figure 8B:
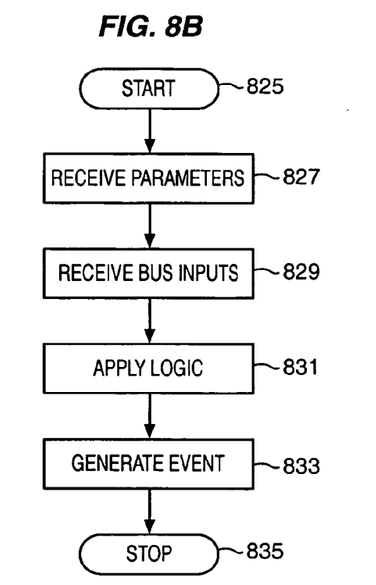
FIG. 8B shows a second conceptual flow process performed according to an embodiment of the invention.

A separate process, as shown in FIG. 8B, is started at block 825. This process may be simultaneous and independent or it may correspond to the logic structure's portion of the process described above. The flexible logic receives parameters for its configurable registers 315, 321, 323 at block 827. The particular parameters for the mask, delay and compare registers may depend upon the desired function. The flexible logic also receives bus inputs on e.g. the debug bus at block 829. The flexible logic then applies the logic as determined by the registers at block 831 and a corresponding event is generated at block 833. When the event is generated, a commanded action may be triggered, such as an interrupt, a pin output, an output event for line 251 etc. This process then stops at block 835. The command flows of FIGS. 8A and 8B can be repeated or combined with other command flows to produce a wide variety of different tests. In addition, the selection of the events and the locations of the events provides great flexibility in defining tests.

Figure 9:
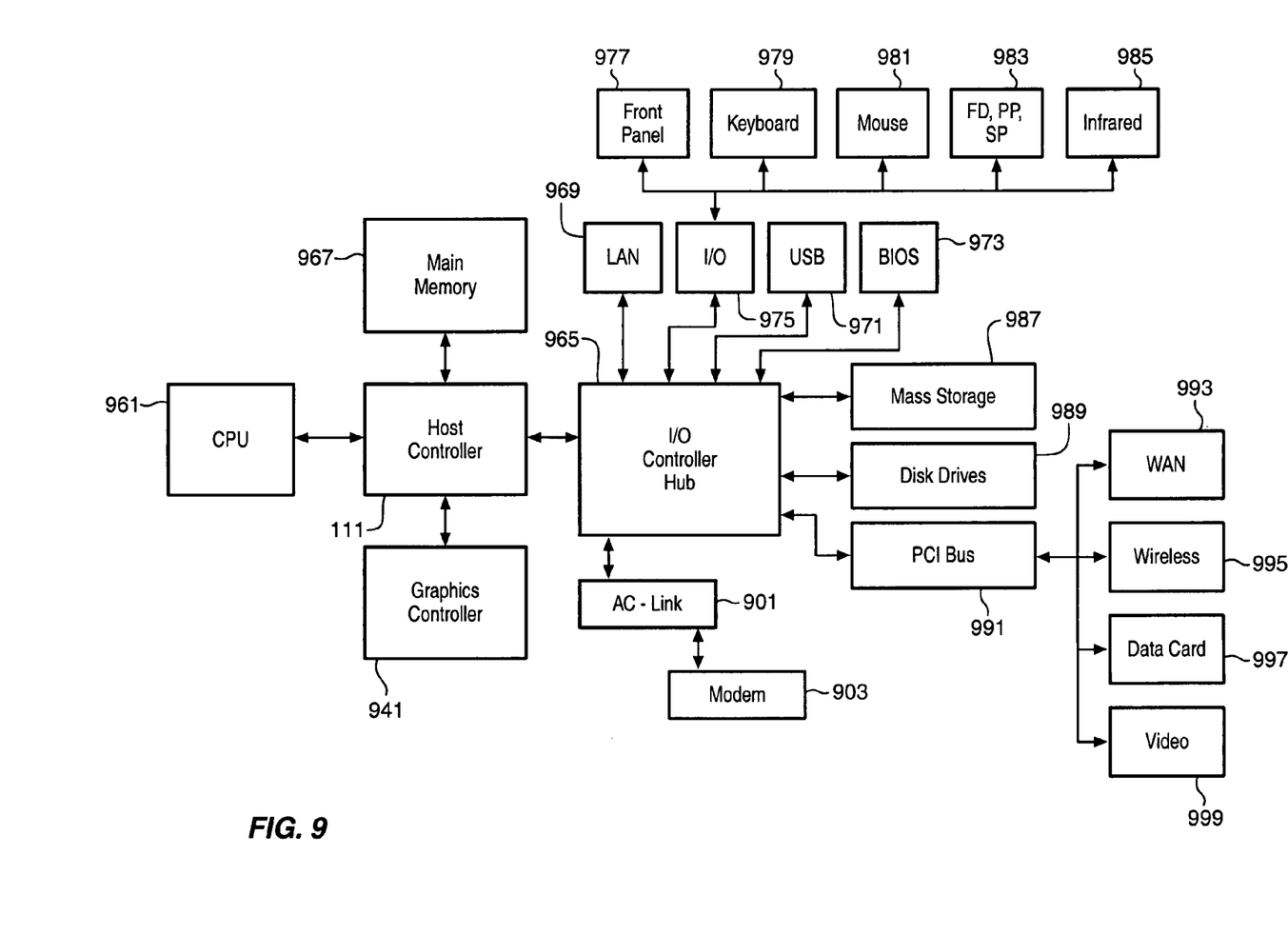
FIG. 9 is a block diagram of a computing system suitable for implementing an embodiment of the present invention.

FIG. 9 shows a computer system suitable for use with the MCH chip described above. While embodiments of the present invention can be adapted for application on a great number of different ICs, the present example is described in the context of a chipset that supports a microprocessor. In this example, the computer system may include a CPU (Central Processing Unit) 961 coupled to a chipset component 111 of the type described herein, i.e. a Memory Controller Hub (MCH) chip. The MCH chip functions as part of a supporting chipset for the CPU. The MCH chip is coupled to main memory 967, such as DRAM and to a graphics controller 941, using interfaces shown, for example, in FIG. 1.

The MCH chip 111 is also coupled to an ICH (Input/Output controller hub) chip 965. The ICH chip offers connectivity to a wide range of different devices. Well-established conventions and protocols may be used for these connections. The connections may include a LAN (Local Area Network) port 69, a USB hub 971, and a local BIOS (Basic Input/Output System) flash memory 973. A SIO (Super Input/Output) port 975 may provide connectivity for a front panel 977 with buttons and a display, a keyboard 979, a mouse 981, and infrared devices 985, such as remote control sensors. The I/O port may also support floppy disk, parallel port, and serial port connections. Alternatively, any one or more of these devices may be supported from a USB, PCI or any other type of bus.

The ICH may also provide an IDE (Integrated Device Electronics) bus for connections to disk drives 987, 989 or other large memory devices. The mass storage may include hard disk drives and optical drives. So, for example, software programs, user data, and data files may be stored on a hard disk drive or other drive. In addition CD's (Compact Disk), DVD's (Digital Versatile Disk) and other storage media may be played on drives coupled to the IDE bus.

A PCI (Peripheral Component Interconnect) bus 991 is coupled to the ICH and allows a wide range of devices and ports to be coupled to the ICH. The examples in FIG. 9 include a WAN (Wide Area Network) port 993, a Wireless port 995, a data card connector 997, and a video adapter card 999. There are many more devices available for connection to a PCI port and many more possible functions. The PCI devices may allow for connections to local equipment, such as cameras, memory cards, telephones, PDA's (Personal Digital Assistant), or nearby computers. They may also allow for connection to various peripherals, such as printers, scanners, recorders, displays and more. They may also allow for wired or wireless connections to more remote equipment or any of a number of different interfaces. The remote equipment may allow for communication of programming data, for maintenance or remote control or for gaming, Internet surfing or other capabilities.

Finally, the ICH is shown with an AC-Link (Audio Codec Link) 901, a digital link that supports codecs with independent functions for audio and modem. In the audio section, microphone input and left and right audio channels are supported. In the example of FIG. 9, the AC-Link supports a modem 903 for connection to the PSTN. As can be seen from FIG. 9, the architecture of FIG. 9 allows for a wide range of different functions and capabilities. The particular design will depend on the particular application.

It is to be appreciated that a lesser or more equipped logic structure, counter block, chip, and computer system than the examples described above may be preferred for certain implementations. Therefore, the configurations may vary from implementation to implementation depending upon numerous factors, such as price constraints, performance requirements, technological improvements, or other circumstances. Embodiments of the invention may also be applied to other types of software-driven systems that use different hardware architectures than that shown in the Figures.

In the description above, for purposes of explanation, numerous specific details are set forth in order to provide a thorough understanding of embodiments of the present invention. It will be apparent, however, to one skilled in the art that embodiments of the present invention may be practiced without some of these specific details. In other instances, well-known structures and devices are shown in block diagram form.

Embodiments of the present invention may include various operations. The operations of embodiments of the present invention may be performed by hardware components, such as those shown in the Figures, or may be embodied in machine-executable instructions, which may be used to cause general-purpose or special-purpose processor or logic circuits programmed with the instructions to perform the operations. Alternatively, the operations may be performed by a combination of hardware and software.

Embodiments of the present invention may be provided as a computer program product which may include a machine-readable medium having stored thereon instructions which may be used to program a computer system (or other electronic devices) to perform a process according to embodiments of the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, embodiments of the present invention may also be downloaded as a computer program product, wherein the program may be transferred from a remote computer to a requesting computer by way of data signals embodied in a carrier wave or other propagation medium via a communication link (e.g., a modem or network connection).

Many of the methods and apparatus are described in their most basic form but operations may be added to or deleted from any of the methods and components may be added or subtracted from any of the described apparatus without departing from the basic scope of the present claims. It will be apparent to those skilled in the art that many further modifications and adaptations may be made. The particular embodiments are not provided as limitations but as illustrations. The scope of the claims is not to be determined by the specific examples provided above but only by the claims below.

What is claimed is:

1. An apparatus comprising:
a logic structure integrated in an integrated circuit (IC), the logic structure having a set of bus inputs to generate events, a mask register to select inputs from among the set of bus inputs, a logic register to select logic to apply to the selected inputs and an event output to supply the result of the applied logic;
a bus interface integrated in the IC and coupled to the logic structure to transmit settable parameters to the mask register and the logic register of the logic structure from an external agent
a debug bus coupled to the bus inputs;
a test mode unit coupled to the debug bus;
node observation architecture logic to interface with the debug bus and control events generated by the logic structure; and
external pins coupled to an external pin observation block for communication with the external agent through the test mode unit.

2. The apparatus of claim 1, wherein the logic register comprises a delay register to apply selected delays to the selected inputs.

3. The apparatus of claim 1, wherein the logic register comprises a compare register to set compare functions to apply to the selected inputs.

4. The apparatus of claim 1, further comprising a configuration bus for receiving the settable parameters from the external agent and providing them to the logic structure.

5. The apparatus of claim 1, wherein the bus interface allows the event output tobe read by the external agent.

6. The apparatus of claim 1, wherein the logic structure further generates a system management interrupt based on the event output.

7. An apparatus comprising:
a counter register integrated in an integrated circuit (IC) and coupled with an external unit integrated in the IC to receive results of operations from the external unit;
a logic structure integrated in the IC to receive signals from the external unit, to send operations to the external unit, to generate events based on the received external signals and received settable parameters, and to send the events to the counter register to affect the operation of the counter register, the logic structure having a comparator to produce comparisons using the signals received from the external unit; and
a bus interface integrated in the IC and coupled to the logic structure to transmit settable parameters to the logic structure from an external agent.

8. The apparatus of claim 7, further comprising a mask register coupled to the bus interface and to the logic structure, the mask register receiving settable values from the bus interface, the settable values selecting portions of the signals received from the external unit.

9. The apparatus of claim 7, further comprising a delay register coupled to the bus interface and the logic structure to select delays for portions of the signals received from the external unit.

10. The apparatus of claim 7, further comprising a compare register coupled to the bus interface and the comparator to select a compare functions to be executed by the comparator.

11. The apparatus of claim 7, further comprising a clock source register coupled to the logic structure to select a clock source of the IC for use by the logic structure.

12. The apparatus of claim 7, wherein the bus interface further allows the counter register to be read by the external agent.

13. The apparatus of claim 7, wherein the counter register further generates an interrupt based on results of operations form the external unit.

14. A method comprising:
receiving settable parameters in a logic structure of an integrated circuit (IC) from an external agent integrated in the IC through a bus interface integrated in the IC and coupled to the logic structure;
receiving signals in the logic structure from an external unit integrated in the IC;
sending operations from the logic structure to the external unit;
receiving results of operations performed by the external unit in a counter structure of the IC;
applying logic to the received signals and received settable parameters in the logic structure to generate an event using a comparator to produce comparisons using the signals received from the external unit; and
applying the events to the counter structure.

15. The method of claim 14, further comprising providing the events over a bus to the external agent.

16. The method of claim 14, further comprising generating an interrupt based on the event.

17. The method of claim 14, further comprising applying selected delays to the selected inputs based on the received settable parameters.

18. The method of claim 14, wherein using a comparator comprises applying compare functions to the selected inputs based on the received settable parameters.

19. The method of claim 14, further comprising applying a mask in the logic structure to select inputs from among the bus inputs.

20. A method comprising:
receiving settable parameters in a logic structure of an integrated circuit (IC) from an external agent;
receiving a set of bus inputs in the logic structure of the IC;
selecting inputs from among the set of bus inputs based on the settable parameters using a mask register of the logic structure;
applying logic to the selected bus inputs in the logic structure to generate an event the logic being selected based on the settable parameters;
generating a system management interrupt based on the event
controlling events generated by the logic structure using node observation architecture logic to interface with a debug bus coupled to the bus inputs and a test mode unit coupled to the debug bus; and
communicating with the external agent through the test mode unit using external pins coupled to an external pin observation block of the observation architecture logic.

21. The method of claim 20, wherein communicating comprises providing the events over a bus to an external agent.

22. The method of claim 20, further comprising applying selected delays to the selected inputs based on the received settable parameters.

23. The method of claim 20, further comprising applying compare functions to the selected inputs based on the received settable parameters.

24. The method of claim 20, wherein selecting inputs comprises applying a mask in the logic structure to select inputs from among the bus inputs.

* * * * *